United States Patent
Borokhovich et al.

(10) Patent No.: US 10,931,384 B1
(45) Date of Patent: Feb. 23, 2021

(54) CLOSED LOOP TRANSMITTER (TX) CALIBRATION WITH FREQUENCY SEPARATION USING A DIGITAL TO TIME CONVERTER (DTC)

(71) Applicant: Intel Corporation, Santa Clara, CA (US)

(72) Inventors: Eli Borokhovich, Modiin-Maccabim-Reut (IL); Assaf Ben-Bassat, Haifa (IL); Shahar Gross, Nes-Tziona (IL); Nahum Kimiagarov, Holon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/727,512

(22) Filed: Dec. 26, 2019

(51) Int. Cl.
*H04B 17/12* (2015.01)
*H03K 5/131* (2014.01)
*H04B 1/04* (2006.01)
*H03L 7/099* (2006.01)

(52) U.S. Cl.
CPC ............ *H04B 17/12* (2015.01); *H03K 5/131* (2013.01); *H03L 7/0996* (2013.01); *H04B 1/04* (2013.01); *H04B 2001/0491* (2013.01)

(58) Field of Classification Search
CPC .......... H04B 17/12; H04B 1/04; H03K 5/131; H03L 7/0996
See application file for complete search history.

(56) References Cited

U.S. PATENT DOCUMENTS

| | | | |
|---|---|---|---|
| 7,856,048 B1 * | 12/2010 | Smaini ............... | H04B 1/40 375/221 |
| 8,175,549 B2 | 5/2012 | Faust et al. | |
| 9,288,841 B2 * | 3/2016 | Lakdawala .......... | H04B 7/06 |
| 9,431,958 B2 * | 8/2016 | Boos ................ | H03B 5/32 |
| 9,768,809 B2 | 9/2017 | Tertinek et al. | |
| 9,867,155 B1 * | 1/2018 | Tertinek ........... | H04L 1/246 |

(Continued)

OTHER PUBLICATIONS

Nash, Eamon. "Correcting Imperfections in IQ Modulators to Improve RF Signal Fidelity." Analog Devices. AN-1039 Application Note. 2009. 8 pages.

(Continued)

*Primary Examiner* — Nguyen T Vo
(74) *Attorney, Agent, or Firm* — 2SPL Patent Attorneys PartG mbB; Yong Beom Hwang

(57) ABSTRACT

A closed loop transmitter (Tx) calibration system is disclosed. The closed loop Tx calibration system comprises a transmitter circuit configured to generate a Tx output signal at a Tx output frequency based on a Tx local oscillator (LO) signal. The closed loop Tx calibration system further comprises a loop back (LPBK) receiver circuit coupled to the transmitter circuit and configured to downconvert the Tx output signal at the Tx output frequency to form an LPBK baseband signal at an LPBK intermediate frequency (IF), based on an LPBK LO signal. In some embodiments, the LPBK IF frequency is different from zero. In some embodiments, the closed loop Tx calibration system further comprises an LO generation circuit configured to generate the Tx LO signal and the LPBK LO signal from a single phase locked loop (PLL) source, based on utilizing a digital to time converter (DTC) circuit.

13 Claims, 6 Drawing Sheets

(56) References Cited

U.S. PATENT DOCUMENTS

2008/0192877 A1* 8/2008 Eliezer ................. H03L 7/1806
375/376
2014/0018014 A1* 1/2014 Modha .................... H04B 1/30
455/78

OTHER PUBLICATIONS

Stauth, Jason Thaine et al. "Energy Efficient Wireless Transmitters: Polar and Direct-Digital Modulation Architectures." Technical Report No. UCB/EECS-2009-22. http://www.eecs.berkeley.edu/Pubs/TechRpts/2009/EECS-2009-22.html. Feb. 4, 2009. 199 pages.
Razavi, Behzad. "RF Transmitter Architectures and Circuits." IEEE 1999 Custom Integrated Circuits Conference. 8 pages.

\* cited by examiner

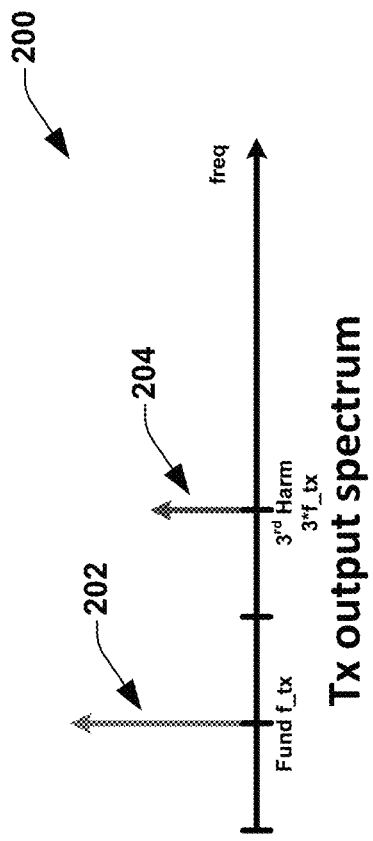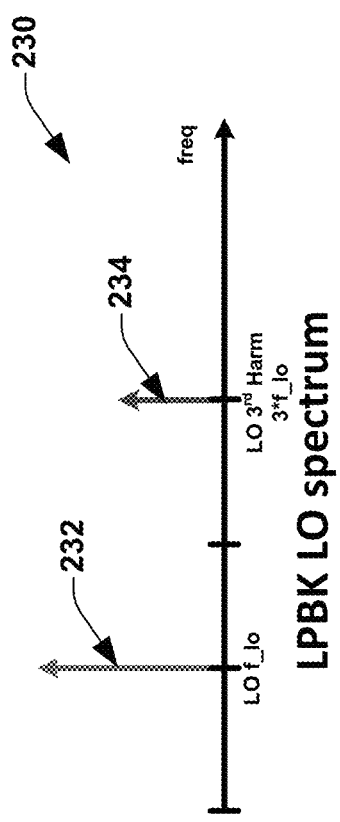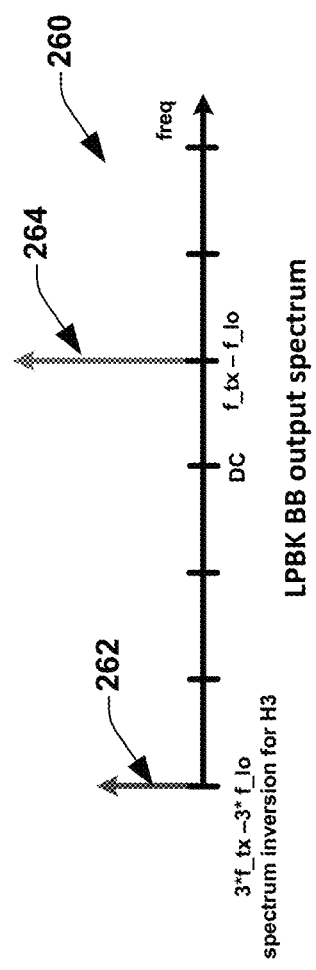
FIG. 2

CLOSED LOOP TRANSMITTER (TX) CALIBRATION WITH FREQUENCY SEPARATION USING A DIGITAL TO TIME CONVERTER (DTC)

FIELD

The present disclosure relates to wireless communication systems, and in particular, to a system and a method for closed loop transmitter (Tx) calibration in wireless communication systems.

BACKGROUND

New generations of wireless communication systems require reliability, high-speed data transmission, high mobility, and spectrum and power efficiency. Bandwidth intensive multimedia applications have boosted the evolution of wireless technology, e.g., mobile television service via digital video broadcasting (DVB) and wireless teleconferencing. A radio transmitter consists of several pieces that work together to transmit information. The radio frequency (RF) front-end at the transmitter consists of several elements which may introduce impairments and distortion to the signals transmitted by the transmitter, thereby affecting the communication system performance. In order to compensate for the impairments associated with the transmitters, most modern integrated transmitters utilize linearity calibration.

BRIEF DESCRIPTION OF THE DRAWINGS

Some examples of circuits, apparatuses and/or methods will be described in the following by way of example only. In this context, reference will be made to the accompanying Figures.

FIG. 2 depicts a frequency spectrum of a Tx output signal, a loopback (LPBK) local oscillator (LO) signal and a LPBK baseband signal associated with a closed loop Tx calibration system, according to one embodiment of the disclosure.

DETAILED DESCRIPTION

Figure 1:
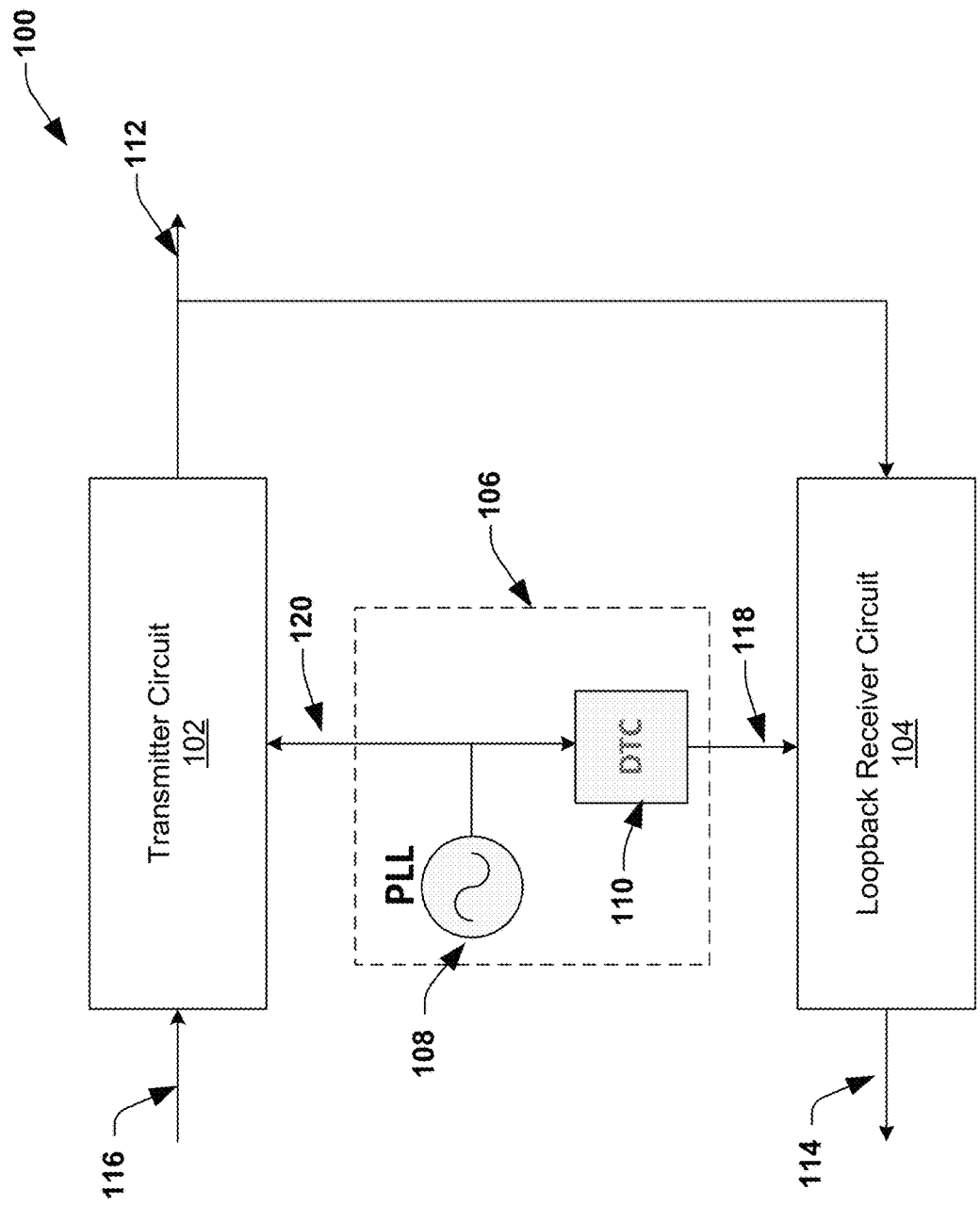
FIG. 1 illustrates a simplified block diagram of a closed loop transmitter (Tx) calibration system, according to one embodiment of the disclosure.

In one embodiment of the disclosure, a closed loop transmitter (Tx) calibration system is disclosed. The closed loop Tx calibration system comprises a transmitter circuit configured to generate a Tx output signal at a Tx output frequency based on a Tx local oscillator (LO) signal. In some embodiments, the closed loop Tx calibration system further comprises a loop back (LPBK) receiver circuit coupled to the transmitter circuit and configured to downconvert the Tx output signal at the Tx output frequency to form an LPBK baseband signal, based on an LPBK LO signal. In addition, in some embodiments, the closed loop Tx calibration system comprises an LO generation circuit configured to generate the Tx LO signal and the LPBK LO signal from a single phase locked loop (PLL) source, based on utilizing a digital to time converter (DTC) circuit.

In one embodiment of the disclosure, a closed loop transmitter (Tx) calibration system is disclosed. The closed loop Tx calibration system comprises a transmitter circuit configured to generate a Tx output signal at a Tx output frequency based on a Tx local oscillator (LO) signal. In some embodiments, the closed loop Tx calibration system further comprises a loop back (LPBK) receiver circuit coupled to the transmitter circuit and configured to downconvert the Tx output signal to form an LPBK baseband signal, based on an LPBK LO signal. In addition, in some embodiments, the closed loop Tx calibration system comprises an LO generation circuit comprising a phase locked loop (PLL) circuit configured to generate the Tx LO signal, and a digital to time converter (DTC) circuit coupled to the PLL circuit and configured to generate the LPBK LO signal based on the Tx LO signal.

In one embodiment of the disclosure, a method for closed loop transmitter (Tx) calibration is disclosed. The method comprises generating, at a transmitter circuit, a Tx output signal at a Tx output frequency based on a Tx local oscillator (LO) signal. The method further comprises downconverting, using a loop back (LPBK) receiver circuit coupled to the transmitter circuit, the Tx output signal at the Tx output frequency to form an LPBK baseband signal at an LPBK intermediate frequency (IF), based on an LPBK LO signal. In some embodiments, the LPBK IF frequency is different from zero. In addition, the method comprises generating, at an LO generation circuit, the Tx LO signal and the LPBK LO signal, from a single phase locked loop (PLL) source based on utilizing a digital to time converter (DTC) circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, most modern integrated transmitters require linearity calibration, in order to compensate for the impairments associated with the transmitter. Closed-loop calibration is usually a preferred method of linearity calibration as it allows real-time linearity tracking and fixing. In order to perform closed-loop calibration of transmitters, a loopback (LPBK) receiver circuit is utilized which down converts an output signal of the transmitter, that is, a transmitter (Tx) output signal, based on an LPBK local oscillator (LO) signal, in order to reconstruct a baseband signal of the transmitter. In some embodiments, the reconstructed baseband signal is compared with the original baseband signal of the transmitter, in order to determine the associated impairments and perform the calibration. Two currently utilized methods for close-loop calibration comprises direct conversion and frequency separation. In order to perform the direct conversion based closed-loop calibration, a direct conversion transmitter and a direct conversion LPBK receiver circuit are utilized. The direct conversion transmitter upconverts a transmit baseband signal (i.e., the original baseband signal) at baseband frequency (i.e., 0 Hz) in to a transmitter (Tx) output signal based on a Tx local oscillator (LO) signal. The direct conversion LPBK receiver circuit downconverts (e.g., using a mixer circuit) the Tx output signal to a LPBK baseband signal (i.e., the reconstructed baseband signal) at the baseband frequency (i.e., 0 Hz), based on an LPBK LO signal. In some embodiments, the Tx LO signal and the LPBK LO signal are provided from the same PLL and both the signals are the same.

In order to downconvert the Tx output signal to the LPBK baseband signal at the baseband frequency (i.e., 0 Hz), in some embodiments, a frequency of the LPBK LO signal is kept to be the same as a frequency of the Tx output signal. However, downconverting the Tx output signal to the LPBK baseband signal at the baseband frequency (i.e., 0 Hz) may result in harmonic aliasing. In other words, since both Tx output signal and LPBK LO frequencies are the same, mixing them generates the required baseband signal (wanted signal) around DC (i.e., 0 Hz). A harmonic component (e.g., a $3^{rd}$ harmonic component) of the TX output signal and a harmonic component (e.g., a $3^{rd}$ harmonic component) of the LPBK LO signal may also share the same frequency and mix also to DC, thereby masking the wanted signal. This is an unwanted effect which deteriorates the calibration performance. To reduce Tx harmonic aliasing in direct conversion loopback circuits, a harmonic filter (to filter out the harmonic frequencies) is incorporated between the Tx output and loopback receiver input. However, the rejection needed from this filter to completely eliminate this effect is usually very high and difficult to obtain in a real design. Further, the required Tx harmonic filter in RF frequencies is Inductor based which uses a lot of Silicon area. Furthermore, in all direct conversion loopback designs, separation of the receiver (RX) and TX in-phase quadrature (I/O) imbalance can be difficult, thus this solution requires the implementation of a separation mechanism between loopback receiver IQ imbalance and Tx impairments.

In frequency separation based closed-loop calibration, a transmitter and an intermediate frequency (IF) LPBK circuit are utilized. The transmitter upconverts a transmit baseband signal at baseband frequency (i.e., 0 Hz) into a transmitter (Tx) output signal based on a Tx local oscillator (LO) signal. The IF LPBK circuit downconverts the Tx output signal to a LPBK baseband signal at an LPBK IF frequency that is different from zero Hz, based on an LPBK LO signal. In order to downconvert the Tx output signal to the LPBK baseband signal at the LPBK IF frequency, in some embodiments, a frequency of the LPBK LO signal is kept to be different from a frequency of the Tx output signal. Further, in such embodiments, the Tx LO signal and the LPBK LO signal are provided from different PLLs. This approach solves Tx harmonic aliasing, since harmonics are down-converted to different frequencies than fundamental (desired) signal and also allows to separate loopback receiver IQ imbalance. But this requires additional PLL to feed the loopback receiver, which increases the area and power consumption. Further, this approach suffers from un-correlated phase noise of both Tx PLL and loopback receiver PLL, thus degrading the calibration performance.

Therefore, in order to compensate for the above disadvantages, a system and a method for closed loop calibration of transmitters is proposed in this disclosure. In particular, a closed loop transmitter (Tx) calibration system comprising a transmitter circuit configured to generate a Tx output signal, based on a Tx LO signal and an LPBK receiver circuit configured to downconvert the Tx output signal to form a LPBK baseband signal at an LPBK IF frequency that is different from zero, based on an LPBK LO signal is proposed herein. The proposed closed loop Tx calibration circuit further comprises an LO generation circuit comprising a single PLL source configured to generate the Tx LO signal and the LPBK LO signal, based on utilizing a digital to time converter (DTC) circuit. In particular, in one embodiment, the LO generation circuit comprises a single PLL source configured to generate the Tx LO signal, and DTC circuit coupled to the single PLL source and configured to generate the LPBK LO signal based on the Tx LO signal. In some embodiments, the DTC circuit is configured to generate the LPBK LO signal, based on applying a frequency shift to the Tx LO signal. In some embodiments, downconverting the Tx output signal to form the LPBK baseband signal at the LPBK IF frequency that is different from zero enables to avoid harmonic aliasing issues and allows to separate LPBK IQ imbalance from Tx impairments. Further, generating both the Tx LO signal and the LPBK LO signal from a single PLL source based on utilizing the DTC circuit enables to reduce phase noise issues associated with using two different PLLs, as the noise associated with both the Tx LO signal and the LPBK LO signal are correlated (since they both are generated by the same PLL) and therefore can be cancelled. In addition, generating both the Tx LO signal and the LPBK LO signal from a single PLL source reduces area consumption, as the DTC circuit requires much less area than a PLL or a harmonic filter.

FIG. 1 illustrates a simplified block diagram of a closed loop transmitter (Tx) calibration system 100, according to one embodiment of the disclosure. In some embodiments, the closed loop Tx calibration system 100 is configured to perform closed loop calibration of a transmitter circuit associated therewith. In some embodiments, the closed-loop Tx calibration system 100 may be part of a front-end (e.g., radio frequency (RF) front end) of a wireless communication system. The closed loop Tx calibration system 100 comprises a transmitter circuit 102 configured to generate a Tx output signal 112 at a Tx output frequency based on a Tx local oscillator (LO) signal 120. In some embodiments, the Tx output signal 112 comprises a radio frequency (RF) signal at RF frequency. In some embodiments, the transmitter circuit 102 may comprise an in-phase quadrature (IQ) transmitter. In some embodiments, the IQ transmitter may comprise a direct conversion transmitter. In such embodiments, the transmitter circuit 102 may be configured to upconvert a transmit baseband signal 116 at a baseband frequency (i.e., zero frequency), based on the Tx LO signal 120, in order to generate the Tx output signal 112 at the Tx output frequency, further details of which are given in an embodiment below. In direct conversion transmitters, a frequency of the Tx LO signal 120 and the Tx output frequency associated with the Tx output signal 112 is the same.

Alternately, in other embodiments, the transmitter circuit 102 may comprise a polar transmitter. In such embodiments, the transmitter circuit 102 may be configured to generate the Tx output signal 112 at the Tx output frequency based on applying a phase modulation (PM) and/or an amplitude modulation (AM) to the Tx LO signal 120. Therefore, in such embodiments, a frequency of the Tx LO signal 120 and the Tx output frequency associated with the Tx output signal 112 is the same. Further, in some embodiments, the transmitter circuit 102 may comprise a heterodyne transmitter. In such embodiments, the transmitter circuit 102 may be configured to upconvert a transmit intermediate frequency (IF) signal at a transmit intermediate frequency (IF) (that comprises an upconverted version of the transmit baseband signal 116) that is different from zero frequency, based on the Tx LO signal 120, in order to generate the Tx output signal 112 at the Tx output frequency, further details of which are given in an embodiment below. In heterodyne transmitters, a frequency of the Tx LO signal 120 and the Tx output frequency associated with the Tx output signal 112 are different. Furthermore, other types of transmitter circuits different from above are also contemplated to be within the scope of this disclosure.

The closed loop Tx calibration system 100 further comprises a loopback (LPBK) receiver circuit 104 configured to receive the Tx output signal 112 and downconvert the Tx output signal 112 at the Tx output frequency, to form a LPBK baseband signal 114 at an LPBK IF frequency that is different from zero frequency. In some embodiments, the LPBK baseband signal 114 generated by the LPBK receiver circuit 104 (or a signal associated therewith) is compared with the transmit baseband signal 116 (i.e., the original baseband signal) at one or more processors associated with the closed-loop Tx calibration system 100 to perform the calibration of the transmitter circuit 102. In some embodiments, the LPBK receiver circuit 104 is configured to downconvert the Tx output signal 112 at the Tx output frequency to form the LPBK baseband signal 114 at the LPBK IF frequency, based on an LPBK LO signal 118 (e.g., using a downconversion mixer).

In some embodiments, a frequency of the LPBK LO signal 118 is configured to be different from the Tx output frequency, in order to enable the LPBK receiver circuit 104 to downconvert the Tx output signal 112 at the Tx output frequency into the LPBK baseband signal 114 at the LPBK IF frequency (different from zero). In some embodiments, downconverting the Tx output signal 112 at the Tx output frequency to form the LPBK baseband signal 114 at the LPBK IF (different from zero Hz), enables to avoid Tx harmonic aliasing issues associated with the closed-loop calibration of transmitters. For example, graph 200 in FIG. 2 depicts the frequency spectrum of the Tx output signal 112. In particular, the Tx output signal 112 comprises a wanted Tx output signal 202 at a fundamental frequency f_tx (i.e., the Tx output frequency) and a $3^{rd}$ harmonic component 204 (i.e., unwanted signal) at a $3^{rd}$ harmonic Tx output frequency 3*f_tx. Further, graph 230 in FIG. 2 depicts the frequency spectrum of the LPBK LO signal 118. In particular, the LPBK LO signal 118 comprises a wanted LO signal 232 at an LPBK LO frequency f_lo and a $3^{rd}$ harmonic component 234 (i.e., unwanted signal) at a $3^{rd}$ harmonic LPBK LO frequency 3f_10. As can be seen in the graph 230, the frequency of the LPBK LO signal 118 f_lo is configured to be different from the frequency of the Tx output signal 112 f_tx in the graph 200.

In addition, graph 260 in FIG. 2 depicts a complex frequency spectrum of the LPBK baseband signal 114. In particular, the LPBK baseband (BB) signal 114 comprises a wanted LPBK BB signal 262 at an LPBK BB frequency (at f_tx-f_lo) and a $3^{rd}$ harmonic component 264 (i.e., unwanted signal) at a $3^{rd}$ harmonic LPBK BB frequency (at 3*f_tx-3*f_lo). As can be seen in the graph 260, the wanted LPBK BB signal 262 and the unwanted $3^{rd}$ harmonic component 264 do not overlap, thereby avoiding harmonic aliasing.

In addition, the closed loop Tx calibration system 100 comprises an LO generation circuit 106 configured to generate the Tx LO signal 120 and the LPBK LO signal 118 from a single phase locked loop (PLL) source 108, based on utilizing a digital to time converter (DTC) circuit 110. In some embodiments, the Tx LO signal 120 and the LPBK LO signal 118 may have different frequencies. In some embodiments, the DTC circuit 110 may be configured to change a frequency of a signal, thereby making it possible to generate both Tx LO signal 120 and the LPBK LO signal 118 at different frequencies from the single PLL source 108. In particular, a DTC circuit (e.g., the DTC circuit 110) modulates the phase of the signal and when a linear phase ramp modulation is performed using the DTC, a frequency of the signal is changed.

In some embodiments, the LO generation circuit 106 comprises a PLL circuit 108 comprising the single PLL source configured to generate the Tx LO signal 120, and the DTC circuit 110 coupled to the PLL circuit 108 and configured to generate the LPBK LO signal 118 based on the Tx LO signal 120. In some embodiments, the DTC circuit 110 is configured to generate the LPBK LO signal 118, based on applying a frequency shift to the Tx LO signal 120. Alternately, in other embodiments, where the Tx LO signal 120 and the LPBK LO signal 118 may comprise the same signal (i.e., the same frequency), the DTC circuit 110 may not apply a frequency shift to the Tx LO signal 120 (i.e., the frequency shift applied by the DTC circuit 110 may be zero), in order to generate the LPBK LO signal 118. Further, although not shown here, in other embodiments, the PLL circuit 108 may be configured to generate the LPBK LO signal 118, and the DTC circuit 110 may be coupled to the PLL circuit 108 and configured to generate the Tx LO signal 120 based on the LPBK LO signal 118. In some embodiments, generating both the Tx LO signal 120 and the LPBK LO signal 118 from the same PLL circuit 108 enables to reduce area consumption and phase noise issues related to using different PLL sources for Tx LO signal 120 and LPBK LO signal 118.

Figure 3:
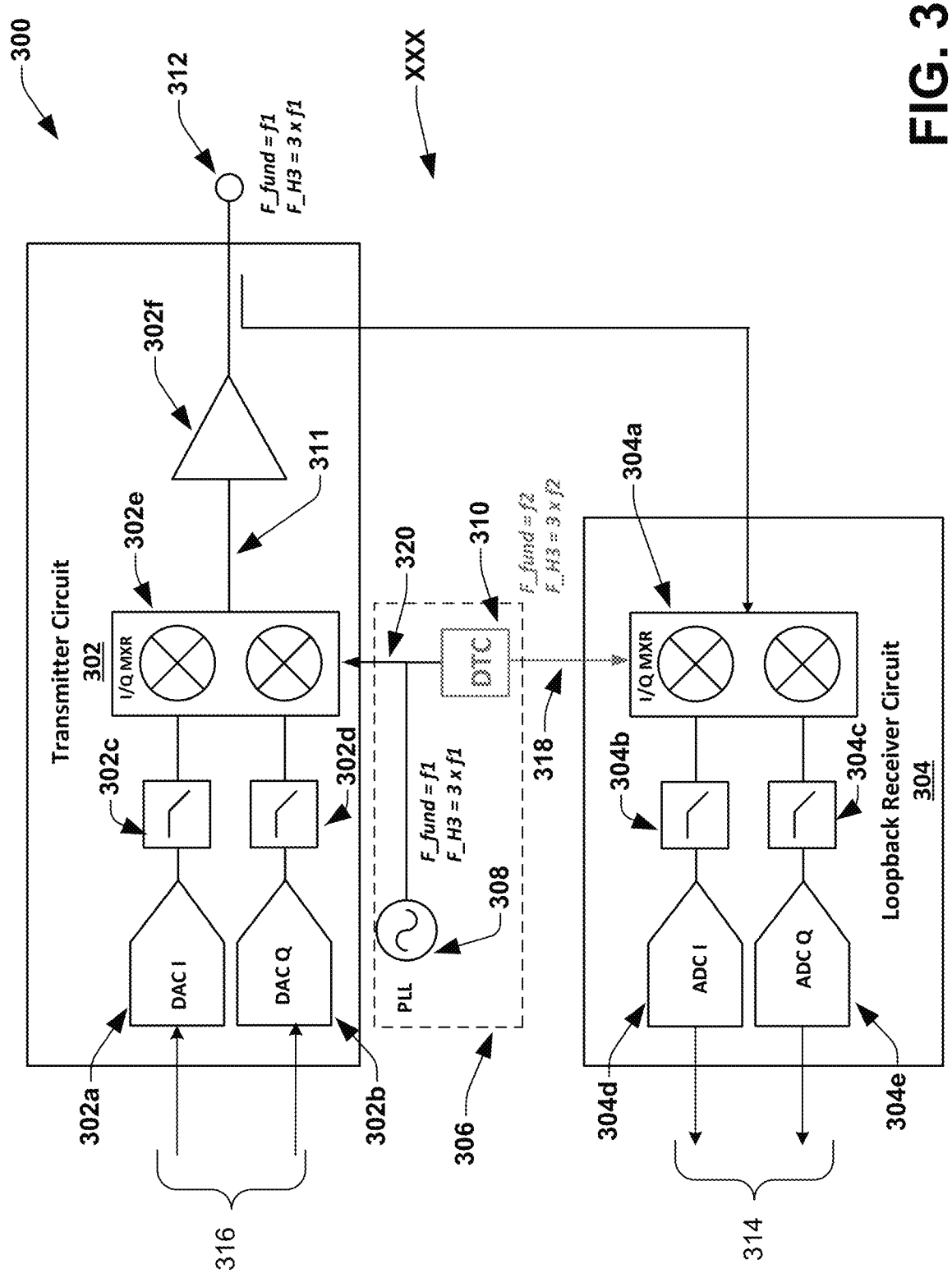
FIG. 3 illustrates an exemplary block diagram of a closed loop transmitter (Tx) calibration system, according to one embodiment of the disclosure.

FIG. 3 illustrates an exemplary block diagram of a closed loop transmitter (Tx) calibration system 300, according to one embodiment of the disclosure. In some embodiments, the closed loop Tx calibration system 300 is configured to perform closed loop calibration of an in-phase quadrature (IQ) transmitter circuit associated therewith. In some embodiments, the closed-loop Tx calibration system 300 may be part of a front-end (e.g., radio frequency (RF) front end) of a wireless communication system. In some embodiments, the closed loop Tx calibration system 300 depicts one possible way of implementation of the closed loop Tx calibration system 100 in FIG. 1. The closed loop Tx calibration system 300 comprises a transmitter circuit 302 configured to generate a Tx output signal 312 at a TX output frequency f1. The transmitter circuit 302 comprises an in-phase quadrature (IQ) transmitter. The transmitter circuit 302 is configured to generate the Tx output signal 312 by upconverting a transmit baseband signal 316 at a transmit baseband frequency (i.e., 0 Hz), based on a Tx local oscillator (LO) signal 320 at a TX LO frequency f1. In some embodiments, the transmitter circuit 302 is further referred to as a direct conversion transmitter.

In some embodiments, the transmitter circuit 302 comprises an in-phase digital-to-analog converter (DAC I) 302a configured to convert an inphase (I) component of the transmit baseband signal 316 into analog domain. Further, the transmitter circuit 302 comprises a quadrature digital-to-analog converter (DAC Q) 302b configured to convert a quadrature (Q) component of the transmit baseband signal 316 into analog domain. Furthermore, the transmitter circuit 302 comprises low pass filter circuits 302c and 302d configured to filter the I and Q components, respectively, of the analog version of the transmit baseband signal 316. In addition, the transmitter circuit 302 comprises an IQ mixer circuit 302e configured to generate a Tx signal 311 based on upconverting the I and Q components of analog version of the transmit baseband signal 316 at the outputs of the low pass filter circuits 302c and 302d, respectively, in accordance with the Tx LO signal 320. In some embodiments, the transmitter circuit 302 further comprises a power amplifier (PA) circuit 302f configured to generate the Tx output signal 312 based on amplifying the Tx signal 311.

The closed loop Tx calibration system 300 further comprises a loopback (LPBK) receiver circuit 304 configured to receive the Tx output signal 312 and downconvert the Tx output signal 312 at the Tx output frequency f1, to form an LPBK baseband signal 314 at an LPBK IF frequency that is different from zero frequency, based on an LPBK LO signal 318. In some embodiments, a frequency f2 of the LPBK LO signal 318 is configured to be different from the Tx output frequency f1, in order to enable the LPBK receiver circuit 304 to downconvert the Tx output signal 312 at the Tx output frequency to form the LPBK baseband signal 314 at the LPBK IF frequency (different from zero). In some embodiments, the LPBK receiver circuit 304 comprises a downconversion mixer circuit 304a configured to downconvert the Tx output signal 312 to form an analog version of the LPBK baseband signal 314 at the LPBK IF frequency that is different from zero, based on the LPBK LO signal 318. Further, the LPBK receiver circuit 304 comprises low pass filter circuits 304b and 304c configured to filter the I and Q components, respectively, of the analog version of the LPBK baseband signal 314 at the output of the downconversion mixer circuit 304a. Furthermore, the LPBK receiver circuit 304 comprises an in-phase analog-to-digital converter (ADC I) 304d configured to convert the inphase (I) component of the analog version of the LPBK baseband signal 314 at the output of the low pass filter circuit 304b into digital domain. Further, the LPBK receiver circuit 304 comprises a quadrature analog-to-digital converter (ADC Q) 304e configured to convert the quadrature (Q) component of the analog version of the LPBK baseband signal 314 at the output of the low pass filter circuit 304b into digital domain.

In addition, the closed loop Tx calibration system 300 comprises an LO generation circuit 306 configured to generate the Tx LO signal 320 and the LPBK LO signal 318. The LO generation circuit 306 comprises a phase locked loop (PLL) circuit 308 comprising a single PLL source configured to generate the Tx LO signal 320 at frequency f1, and a digital-to-time converter (DTC) circuit 310 coupled to the PLL circuit 308 and configured to generate the LPBK LO signal 318 at frequency f2, based on applying a frequency shift to the Tx LO signal 320.

Figure 4:
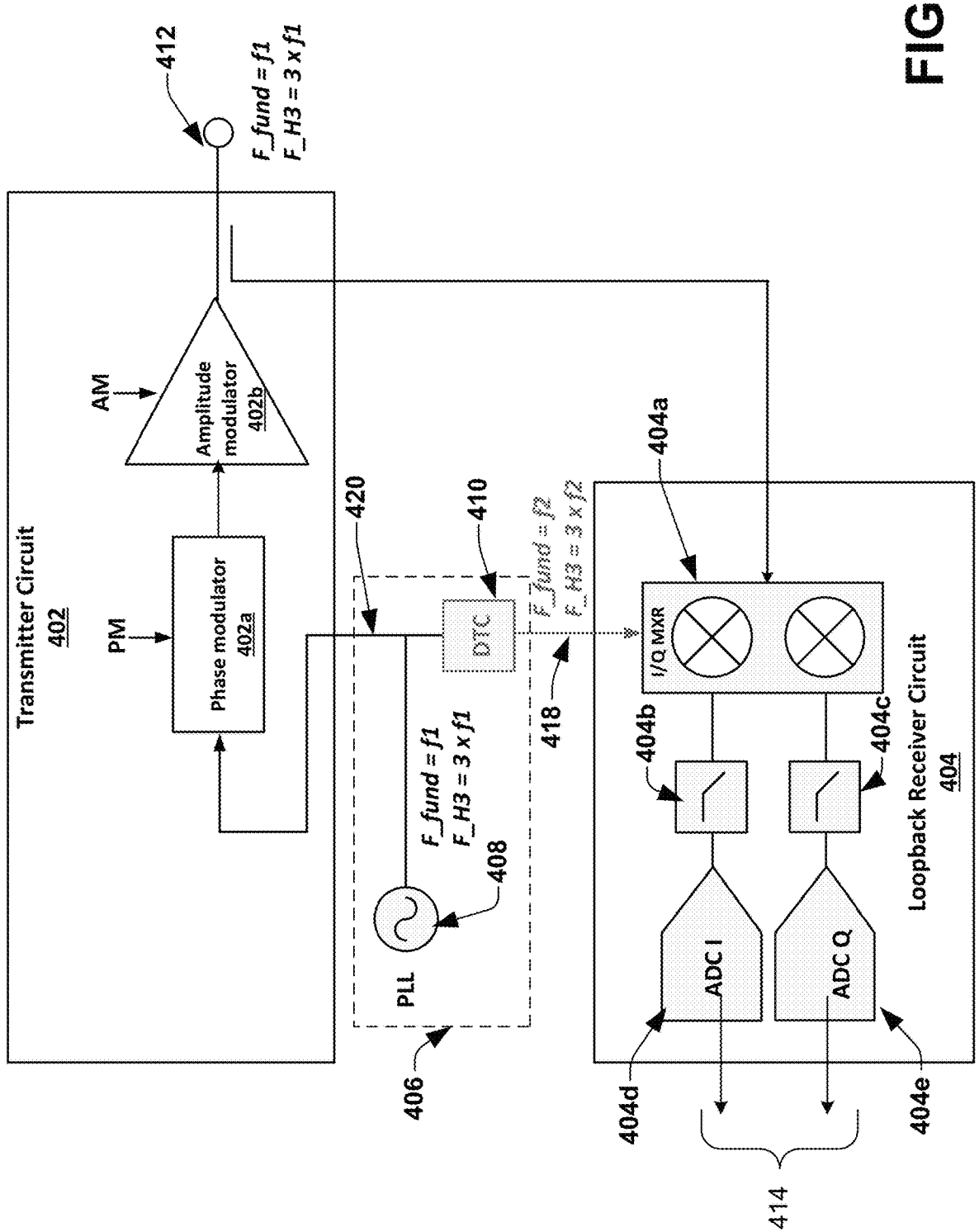
FIG. 4 illustrates an exemplary block diagram of a closed loop transmitter (Tx) calibration system, according to another embodiment of the disclosure.

FIG. 4 illustrates an exemplary block diagram of a closed loop transmitter (Tx) calibration system 400, according to another embodiment of the disclosure. In some embodiments, the closed loop Tx calibration system 400 is configured to perform closed loop calibration of a polar transmitter circuit associated therewith. In some embodiments, the closed-loop Tx calibration system 400 may be part of a front-end (e.g., radio frequency (RF) front end) of a wireless communication system. In some embodiments, the closed loop Tx calibration system 400 depicts another possible way of implementation of the closed loop Tx calibration system 100 in FIG. 1. The closed loop Tx calibration system 400 comprises a transmitter circuit 402 configured to generate a Tx output signal 412 at a TX output frequency f1. The transmitter circuit 402 comprises a polar transmitter (e.g., a digital polar transmitter or an analog polar transmitter). The transmitter circuit 402 is configured to generate the Tx output signal 412 by applying a phase modulation (PM) and an amplitude modulation (AM) to a Tx local oscillator (LO) signal 420 at a TX LO frequency f1. The transmitter circuit 402 is configured to apply the PM and the AM to the Tx LO signal 420, in accordance with a phase and an amplitude associated with a transmit baseband signal (not shown here). In some embodiments, the transmitter circuit 402 comprises a phase modulator circuit 402*a* configured to apply the PM to the Tx LO signal 420 and an amplitude modulator circuit 402*b* configured to apply the AM to the Tx LO signal 420, in order to generate the Tx output signal 412.

The closed loop Tx calibration system 400 further comprises a loopback (LPBK) receiver circuit 404 configured to receive the Tx output signal 412 and downconvert the Tx output signal 412 at the Tx output frequency f1, to form an LPBK baseband signal 414 at an LPBK IF frequency that is different from zero frequency, based on an LPBK LO signal 418. In some embodiments, a frequency f2 of the LPBK LO signal 418 is configured to be different from the Tx output frequency f1, in order to enable the LPBK receiver circuit 404 to downconvert the Tx output signal 412 at the Tx output frequency to form the LPBK baseband signal 414 at the LPBK IF frequency (different from zero). In some embodiments, the LPBK receiver circuit 404 comprises a downconversion mixer circuit 404*a* configured to downconvert the Tx output signal 412 to form an analog version of the LPBK baseband signal 414 at the LPBK IF frequency.

Further, the LPBK receiver circuit 404 comprises low pass filter circuits 404*b* and 404*c* configured to filter the I and Q components, respectively, of the analog version of the LPBK baseband signal 414 at the output of the downconversion mixer circuit 404*a*. Furthermore, the LPBK receiver circuit 404 comprises an in-phase analog-to-digital converter (ADC I) 404*d* configured to convert the inphase (I) component of the analog version of the LPBK baseband signal 414 at the output of the low pass filter circuit 404*b* into digital domain. Further, the LPBK receiver circuit 404 comprises a quadrature analog-to-digital converter (ADC Q) 404*e* configured to convert the quadrature (Q) component of the analog version of the LPBK baseband signal 414 at the output of the low pass filter circuit 404*c* into digital domain.

In addition, the closed loop Tx calibration system 400 comprises an LO generation circuit 406 configured to generate the Tx LO signal 420 and the LPBK LO signal 418. The LO generation circuit 406 comprises a phase locked loop (PLL) circuit 408 comprising a single PLL source configured to generate the Tx LO signal 420 at frequency f1, and a digital-to-time converter (DTC) circuit 410 coupled to the PLL circuit 408 and configured to generate the LPBK LO signal 418 at frequency f2, based on applying a frequency shift to the Tx LO signal 420.

Figure 5:
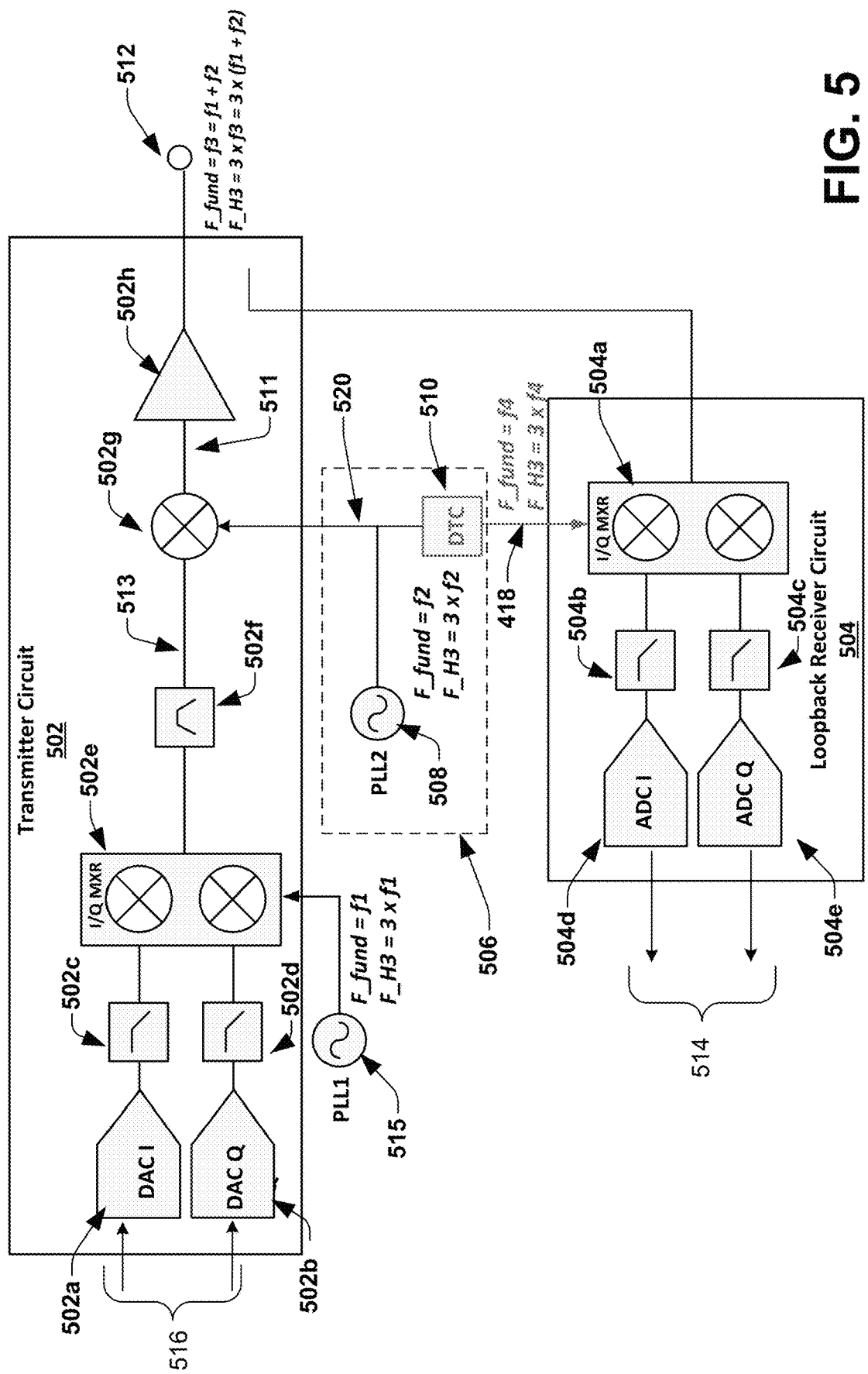
FIG. 5 illustrates an exemplary block diagram of a closed loop transmitter (Tx) calibration system, according to yet another embodiment of the disclosure.

FIG. 5 illustrates an exemplary block diagram of a closed loop transmitter (Tx) calibration system 500, according to yet another embodiment of the disclosure. In some embodiments, the closed loop Tx calibration system 500 is configured to perform closed loop calibration of a heterodyne transmitter circuit associated therewith. In some embodiments, the closed-loop Tx calibration system 500 may be part of a front-end (e.g., radio frequency (RF) front end) of a wireless communication system. In some embodiments, the closed loop Tx calibration system 500 depicts one possible way of implementation of the closed loop Tx calibration system 100 in FIG. 1. The closed loop Tx calibration system 500 comprises a transmitter circuit 502 configured to generate a Tx output signal 512 at a TX output frequency f3. The transmitter circuit 502 comprises a heterodyne transmitter. The transmitter circuit 502 is configured to generate the Tx output signal 512 by upconverting a transmit intermediate frequency (IF) signal 513 at a transmit IF frequency f1 that is different from zero, based on a Tx local oscillator (LO) signal 520 at a TX LO frequency f2.

In particular, the transmitter circuit 502 comprises a transmit upconversion mixer 502*g* configured to upconvert the transmit IF signal 513 based on the Tx LO signal 520, in order to generate the Tx signal 511. In some embodiments, the transmitter circuit 502 further comprises a power amplifier (PA) circuit 502*g* configured to amplify the Tx signal 511 to form the Tx output signal 512. In some embodiments, the Tx output signal 512 comprises a Tx output frequency of f3=f1+f2. In some embodiments, the transmitter circuit 502 is further configured to generate the transmit IF signal 513 at frequency f1 based on upconverting a transmit baseband signal 516 at a transmit baseband frequency (i.e., 0 Hz), in accordance with a transmit baseband LO signal 515 at frequency f1. In some embodiments, the transmitter circuit 502 further comprises an in-phase digital-to-analog converter (DAC I) 502*a* configured to convert an inphase (I) component of the transmit baseband signal 516 into analog domain. Further, the transmitter circuit 502 comprises a quadrature digital-to-analog converter (DAC Q) 502*b* configured to convert a quadrature (Q) component of the transmit baseband signal 516 into analog domain.

Furthermore, the transmitter circuit 502 comprises low pass filter circuits 502*c* and 502*d* configured to filter the I and Q components, respectively, of the analog version of the transmit baseband signal 516. In addition, the transmitter circuit 502 comprises an IQ mixer circuit 502*e* configured to generate the Tx IF signal 513 based on upconverting the I and Q components of the analog version of transmit baseband signal 516, respectively, at the outputs of the low pass filter circuits 502*c* and 502*d*, in accordance with the Tx baseband LO signal 515. In some embodiments, the transmitter circuit 502 further comprises a bandpass filter 502*f* configured to filter an output of the IQ mixer circuit 502*e*, in order to generate the transmit IF signal 513.

The closed loop Tx calibration system 500 further comprises a loopback (LPBK) receiver circuit 504 configured to receive the Tx output signal 512 and downconvert the Tx output signal 512 at the Tx output frequency f3, to form an LPBK baseband signal 514 at an LPBK IF frequency that is different from zero frequency, based on an LPBK LO signal 518. In some embodiments, a frequency f4 of the LPBK LO signal 518 is configured to be different from the Tx output frequency f3, in order to enable the LPBK receiver circuit 504 to downconvert the Tx output signal 512 at the Tx output frequency to form the LPBK baseband signal 514 at the LPBK IF frequency (different from zero). In some embodiments, the LPBK receiver circuit 504 comprises a downconversion mixer circuit 504*a* configured to downconvert the Tx output signal 512 based on the LPBK LO signal at frequency f4, to form an analog version of the LPBK baseband signal 514 at the LPBK IF frequency.

Further, the LPBK receiver circuit 504 comprises low pass filter circuits 504*b* and 504*c* configured to filter the I and Q components, respectively, of the analog version of the LPBK baseband signal 514 at the output of the downconversion mixer circuit 504*a*. Furthermore, the LPBK receiver circuit 504 comprises an in-phase analog-to-digital converter (ADC I) 504*d* configured to convert the inphase (I) component of the analog version of the LPBK baseband signal 514 at the output of the low pass filter circuit 504*b* into digital domain. Further, the LPBK receiver circuit 504 comprises a quadrature analog-to-digital converter (ADC Q) 504*e* configured to convert the quadrature (Q) component of the analog version of the LPBK baseband signal 514 at the output of the low pass filter circuit 504*c* into digital domain.

In addition, the closed loop Tx calibration system 500 comprises an LO generation circuit 506 configured to generate the Tx LO signal 520 and the LPBK LO signal 518. The LO generation circuit 506 comprises a phase locked loop (PLL) circuit 508 comprising a single PLL source configured to generate the Tx LO signal 520 at frequency f2, and a digital-to-time converter (DTC) circuit 510 coupled to the PLL circuit 508 and configured to generate the LPBK LO signal 518 at frequency f4, based on the Tx LO signal 520. In some embodiments, the DTC circuit 510 is configured to generate the LPBK LO signal 518, based on applying a frequency shift to the Tx LO signal 520. In some embodiments, the frequency f2 of the Tx LO signal 520 and the frequency f4 of the LPBK LO signal 518 may be the same. In such embodiments, a frequency shift applied by the DTC circuit to the Tx LO signal 520 may be zero, in order to generate the LPBK LO signal 518.

Figure 6:
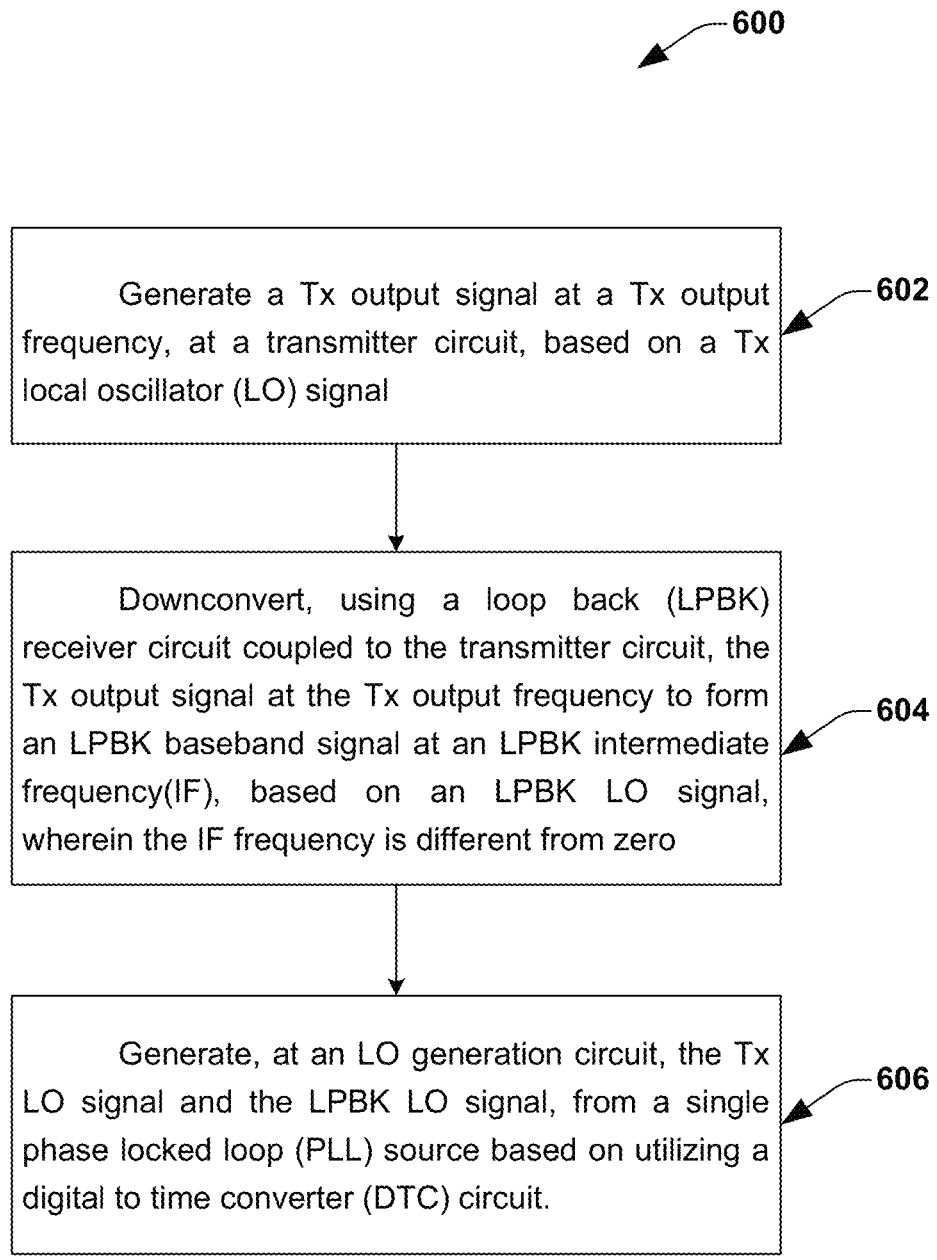
FIG. 6 illustrates a flow chart of a method associated with a closed-loop transmitter (Tx) calibration system, according to one embodiment of the disclosure.

FIG. 6 illustrates a flow chart of a method 600 associated with a closed-loop transmitter (Tx) calibration system, according to one embodiment of the disclosure. The method 600 is explained herein with reference to the closed-loop Tx calibration system 100 in FIG. 1. However, the method is equally applicable to the closed-loop Tx calibration system 300 in FIG. 3, the closed-loop Tx calibration system 400 in FIG. 4 and the closed-loop Tx calibration system 500 in FIG. 5. At 602, a Tx output signal (e.g., the Tx output signal 112 in FIG. 1) at a Tx output frequency is generated at a transmitter circuit (e.g., the transmitter circuit 102 in FIG. 1) based on a Tx local oscillator (LO) signal (e.g., the Tx LO signal 120 in FIG. 1).

In some embodiments, the transmitter circuit may comprise an analog IQ transmitter having a direct conversion architecture, as explained in FIG. 3 above. Alternately, in other embodiments, the transmitter circuit may comprise a polar transmitter, as explained in FIG. 4 above. Further, in some embodiments, the transmitter circuit may comprise a heterodyne transmitter, as explained in FIG. 5 above. Further, other types of transmitter architectures are also contemplated to be within the scope of this disclosure. At 604, the Tx output signal at the Tx output frequency is downconverted to form an LPBK baseband signal (e.g., the LPBK baseband signal 114 in FIG. 1) at an LPBK intermediate frequency (IF), based on an LPBK LO signal (e.g., the LPBK LO signal 118), using a loop back (LPBK) receiver circuit (e.g., the LPBK receiver circuit 104 in FIG. 1) coupled to the transmitter circuit. In some embodiments, the LPBK IF frequency is different from zero. In some embodiments, a frequency of the LPBK LO signal is configured to be different from the Tx output frequency, in order to enable the LPBK receiver circuit to downconvert the Tx output signal at the Tx output frequency to form the LPBK baseband signal at the LPBK IF frequency.

At 606, the Tx LO signal and the LPBK LO signal are generated at an LO generation circuit (e.g., the LO generation circuit 106 in FIG. 1) from a single phase locked loop (PLL) source (e.g., the PLL circuit 108 in FIG. 1) based on utilizing a digital to time converter (DTC) circuit (e.g., the DTC circuit 110 in FIG. 1). In particular, in some embodiments, the Tx LO signal is generated at a PLL circuit comprising the single PLL source, and the LPBK LO signal is generated based on applying a frequency shift to the Tx LO signal using the DTC circuit coupled to the PLL circuit. Alternately, in other embodiments, the LPBK LO signal may be generated at a PLL circuit comprising the single PLL source, and the Tx LO signal may be generated based on applying a frequency shift to the LPBK LO signal using the DTC circuit coupled to the PLL circuit.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a closed loop transmitter (Tx) calibration system comprising a transmitter circuit configured to generate a Tx output signal at a Tx output frequency based on a Tx local oscillator (LO) signal; a loop back (LPBK) receiver circuit coupled to the transmitter circuit and configured to downconvert the Tx output signal at the Tx output frequency, based on an LPBK LO signal, to form an LPBK baseband signal; and an LO generation circuit configured to generate the Tx LO signal and the LPBK LO signal from a single phase locked loop (PLL) source, based on utilizing a digital to time converter (DTC) circuit.

Example 2 is a closed loop Tx calibration system, including the subject matter of example 1, wherein the LO generation circuit comprises a PLL circuit comprising the single PLL source configured to generate the Tx LO signal, and the DTC circuit coupled to the PLL circuit and configured to generate the LPBK LO signal based on the Tx LO signal.

Example 3 is a closed loop Tx calibration system, including the subject matter of examples 1-2, including or omitting elements, wherein the DTC circuit is configured to generate the LPBK LO signal, based on applying a frequency shift to the Tx LO signal.

Example 4 is a closed loop Tx calibration system, including the subject matter of examples 1-3, including or omitting elements, wherein the LPBK baseband signal comprises an LPBK intermediate frequency (IF) that is different from zero.

Example 5 is a closed loop Tx calibration system, including the subject matter of examples 1-4, including or omitting elements, wherein a frequency of the LPBK LO signal is configured to be different from the Tx output frequency, in order to enable the LPBK receiver circuit to downconvert the Tx output signal at the Tx output frequency to form the LPBK baseband signal at the LPBK IF frequency.

Example 6 is a closed loop Tx calibration system, including the subject matter of examples 1-5, including or omitting elements, wherein the LPBK receiver circuit comprises a downconversion mixer circuit configured to downconvert the Tx output signal at the Tx output frequency, based on the LPBK LO signal, in order to form the LPBK baseband signal at the LPBK IF.

Example 7 is a closed loop Tx calibration system, including the subject matter of examples 1-6, including or omitting elements, wherein, when the Tx LO signal and the LPBK LO signal comprises a same frequency, a frequency shift applied by the DTC circuit to the Tx LO signal comprises zero.

Example 8 is a closed loop Tx calibration system, including the subject matter of examples 1-7, including or omitting elements, wherein the LO generation circuit comprises a PLL circuit comprising the single PLL source configured to generate the LPBK LO signal, and the DTC circuit coupled to the PLL circuit and configured to generate the Tx LO signal based on the LPBK LO signal.

Example 9 is a closed loop Tx calibration system, including the subject matter of examples 1-8, including or omitting elements, wherein the transmitter circuit comprises an analog in-phase quadrature (IQ) transmitter comprising a direct conversion transmitter, wherein a frequency of the Tx LO signal and the Tx output frequency associated with the Tx output signal is the same.

Example 10 is a closed loop Tx calibration system, including the subject matter of examples 1-9, including or omitting elements, wherein the transmitter circuit comprises a polar transmitter.

Example 11 is a closed loop Tx calibration system, including the subject matter of examples 1-10, including or omitting elements, wherein the transmitter circuit comprises a heterodyne transmitter, wherein a frequency of the Tx LO signal and the Tx output frequency associated with the Tx output signal are different.

Example 12 is a closed loop transmitter (Tx) calibration system comprising a transmitter circuit configured to generate a Tx output signal at a Tx output frequency based on a Tx local oscillator (LO) signal; a loop back (LPBK) receiver circuit coupled to the transmitter circuit and configured to downconvert the Tx output signal to form an LPBK baseband signal, based on an LPBK LO signal; and an LO generation circuit comprising a phase locked loop (PLL) circuit configured to generate the Tx LO signal, and a digital to time converter (DTC) circuit coupled to the PLL circuit and configured to generate the LPBK LO signal based on the Tx LO signal.

Example 13 a closed loop Tx calibration system, including the subject matter of example 12, wherein the DTC circuit is configured to generate the LPBK LO signal, based on applying a frequency shift to the Tx LO signal.

Example 14 a closed loop Tx calibration system, including the subject matter of examples 12-13, including or omitting elements, wherein the LPBK baseband signal comprises an LPBK intermediate frequency (IF) that is different from zero.

Example 15 a closed loop Tx calibration system, including the subject matter of examples 12-14, including or omitting elements, wherein a frequency of the LPBK LO signal is configured to be different from the Tx output frequency of the Tx output signal, in order to enable the LPBK receiver circuit to downconvert the Tx output signal at the Tx output frequency, in order to form the LPBK baseband signal at the LPBK IF frequency.

Example 16 a closed loop Tx calibration system, including the subject matter of examples 12-15, including or omitting elements, wherein the LPBK receiver circuit comprises a downconversion mixer circuit configured to downconvert the Tx output signal at the Tx output frequency, based on the LPBK LO signal, in order to form the LPBK baseband signal at the LPBK IF.

Example 17 is a method for closed loop transmitter (Tx) calibration comprising generating, at a transmitter circuit, a Tx output signal at a Tx output frequency based on a Tx local oscillator (LO) signal; downconverting, using a loop back (LPBK) receiver circuit coupled to the transmitter circuit, the Tx output signal at the Tx output frequency to form an LPBK baseband signal at an LPBK intermediate frequency (IF), based on an LPBK LO signal, wherein the LPBK IF frequency is different from zero; and generating, at an LO generation circuit, the Tx LO signal and the LPBK LO signal, from a single phase locked loop (PLL) source based on utilizing a digital to time converter (DTC) circuit.

Example 18 is a method, including the subject matter of example 17, wherein generating the Tx LO signal and the LPBK LO signal at the LO generation circuit comprises generating, at a PLL circuit comprising the single PLL source, the Tx LO signal, and generating the LPBK LO signal, based on applying a frequency shift to the Tx LO signal using the DTC circuit coupled to the PLL circuit.

Example 19 is a method, including the subject matter of examples 17-18, including or omitting elements, wherein a frequency of the LPBK LO signal is configured to be different from the Tx output frequency, in order to enable the LPBK receiver circuit to downconvert the Tx output signal at the Tx output frequency to form the LPBK baseband signal at the LPBK IF frequency.

Example 20 is a method, including the subject matter of examples 17-19, including or omitting elements, wherein, when the Tx LO signal and the LPBK LO signal comprises a same frequency, a frequency shift applied by the DTC circuit to the Tx LO signal comprises zero.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

What is claimed is:

1. A closed loop transmitter (Tx) calibration system comprising:
    a transmitter circuit configured to generate a Tx output signal at a Tx output frequency based on a Tx local oscillator (LO) signal;
    a loop back (LPBK) receiver circuit coupled to the transmitter circuit and configured to downconvert the Tx output signal at the Tx output frequency, based on an LPBK LO signal, to form an LPBK baseband signal;
    an LO generation circuit configured to generate the Tx LO signal and the LPBK LO signal from a single phase locked loop (PLL) source, wherein the LPBK baseband signal is at an LPBK intermediate frequency that is different from zero, wherein a frequency of the LPBK LO signal is configured to be different from the Tx output frequency in order to enable the LPBK receiver circuit to downconvert the Tx output signal to generate the LPBK baseband signal at the LPBK intermediate frequency; and an analog-to-digital converter (ADC) configured to convert the LPBK baseband signal at the LPBK intermediate frequency to digital domain.

2. The closed loop Tx calibration system of claim 1, wherein the LO generation circuit comprises:
   a PLL circuit comprising the single PLL source configured to generate the Tx LO signal, and
   a digital-to-time converter (DTC) circuit coupled to the PLL circuit and configured to generate the LPBK LO signal based on the Tx LO signal.

3. The closed loop Tx calibration system of claim 2, wherein the DTC circuit is configured to generate the LPBK LO signal, based on applying a frequency shift to the Tx LO signal.

4. The closed loop Tx calibration system of claim 1, wherein the LPBK receiver circuit comprises a downconversion mixer circuit configured to downconvert the Tx output signal at the Tx output frequency, based on the LPBK LO signal, in order to form the LPBK baseband signal at the LPBK intermediate frequency.

5. The closed loop Tx calibration system of claim 1, wherein the LO generation circuit comprises:
   a PLL circuit comprising the single PLL source configured to generate the LPBK LO signal, and
   a digital-to-time converter (DTC) circuit coupled to the PLL circuit and configured to generate the Tx LO signal based on the LPBK LO signal.

6. The closed loop Tx calibration system of claim 1, wherein the transmitter circuit comprises an analog in-phase quadrature (IQ) transmitter comprising a direct conversion transmitter, wherein a frequency of the Tx LO signal and the Tx output frequency associated with the Tx output signal is the same.

7. The closed loop Tx calibration system of claim 1, wherein the transmitter circuit comprises a polar transmitter.

8. The closed loop Tx calibration system of claim 1, wherein the transmitter circuit comprises a heterodyne transmitter, wherein a frequency of the Tx LO signal and the Tx output frequency associated with the Tx output signal are different.

9. A closed loop transmitter (Tx) calibration system comprising:
   a transmitter circuit configured to generate a Tx output signal at a Tx output frequency based on a Tx local oscillator (LO) signal;
   a loop back (LPBK) receiver circuit coupled to the transmitter circuit and configured to downconvert the Tx output signal to form an LPBK baseband signal, based on an LPBK LO signal;
   an LO generation circuit comprising:
      a phase locked loop (PLL) circuit configured to generate the Tx LO signal, and
      a digital to time converter (DTC) circuit coupled to the PLL circuit and configured to generate the LPBK LO signal based on the Tx LO signal, wherein the LPBK baseband signal is at an LPBK intermediate frequency that is different from zero, wherein a frequency of the LPBK LO signal is configured to be different from the Tx output frequency in order to enable the LPBK receiver circuit to downconvert the Tx output signal to generate the LPBK baseband signal at the LPBK intermediate frequency; and
   an analog-to-digital converter (ADC) configured to convert the LPBK baseband signal at the LPBK intermediate frequency to digital domain.

10. The closed loop calibration system of claim 9, wherein the DTC circuit is configured to generate the LPBK LO signal, based on applying a frequency shift to the Tx LO signal.

11. The closed loop Tx calibration system of claim 9, wherein the LPBK receiver circuit comprises a downconversion mixer circuit configured to downconvert the Tx output signal at the Tx output frequency, based on the LPBK LO signal, in order to form the LPBK baseband signal at the LPBK intermediate frequency.

12. A method for closed loop transmitter (Tx) calibration comprising:
   generating, at a transmitter circuit, a Tx output signal at a Tx output frequency based on a Tx local oscillator (LO) signal;
   downconverting, using a loop back (LPBK) receiver circuit coupled to the transmitter circuit, the Tx output signal at the Tx output frequency to form an LPBK baseband signal at an LPBK intermediate frequency, based on an LPBK LO signal, wherein the LPBK intermediate frequency is different from zero;
   generating, at an LO generation circuit, the Tx LO signal and the LPBK LO signal, from a single phase locked loop (PLL) source, wherein a frequency of the LPBK LO signal is different from the Tx output frequency in order to enable the LPBK receiver circuit to downconvert the Tx output signal to generate the LPBK baseband signal at the LPBK intermediate frequency; and
   converting, using an analog-to-digital converter (ADC), the LPBK baseband signal at the LPBK intermediate frequency to digital domain.

13. The method of claim 12, wherein generating the Tx LO signal and the LPBK LO signal at the LO generation circuit comprises:
   generating, at a PLL circuit comprising the single PLL source, the Tx LO signal, and
   generating the LPBK LO signal, based on applying a frequency shift to the Tx LO signal using a digital-to-time converter (DTC) circuit coupled to the PLL circuit.

* * * * *